United States Patent
Nishihara et al.

(10) Patent No.: US 7,310,262 B2
(45) Date of Patent: Dec. 18, 2007

(54) FERROELECTRIC MEMORY CAPABLE OF CONTINUOUSLY FAST TRANSFERRING DATA WORDS IN A PIPELINE

(75) Inventors: Toshiyuki Nishihara, Kanagawa (JP); Katsuya Nakashima, Nagasaki (JP); Yukihisa Tsuneda, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/507,509

(22) Filed: Aug. 22, 2006

(65) Prior Publication Data

US 2007/0041234 A1    Feb. 22, 2007

(30) Foreign Application Priority Data

Aug. 22, 2005   (JP) ............................. P2005-240057

(51) Int. Cl.
  *G11C 11/22*  (2006.01)
(52) U.S. Cl. ............ 365/145; 365/189.05; 365/189.12; 365/236; 365/238.5; 365/240; 365/200
(58) Field of Classification Search ........... 365/189.12, 365/189.05, 145, 236, 230.02, 238.5, 240, 365/200
See application file for complete search history.

(56) References Cited

U.S. PATENT DOCUMENTS 4,873,664 A    10/1989   Eaton, Jr. ..................... 365/145
5,566,129 A  * 10/1996   Nakashima et al. ..... 365/233.5
6,154,074 A  * 11/2000   Nakashima .................. 327/163
2005/0080762 A1 * 4/2005  Nakashima et al. ........... 707/1

FOREIGN PATENT DOCUMENTS

| EP | 0407202 A2 * | 1/1991 |
| EP | 0631389 A2 * | 12/1994 |
| JP | 09-121032 A  | 5/1997 |
| JP | 2002-197857 A | 7/2002 |

* cited by examiner

*Primary Examiner*—Andrew Q. Tran
(74) *Attorney, Agent, or Firm*—Rader Fishman & Grauer PLLC; Ronald P. Kananen

(57) ABSTRACT

A storage device including a ferroelectric memory cell array including a plurality of memory cells; sense amplifiers connected to the bit lines and selected by a column address; an internal counter able to generate the column address; and a control part controlling data access, wherein the control part accesses data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processing using the column address generated in the internal counter for a group of words read out to the sense amplifiers at the first processing, and a file storage device and a computer system utilizing such a ferroelectric memory.

14 Claims, 10 Drawing Sheets

FIG. 6A  STG1: SELECT OUTPUT WORD FROM SENSE AMPLIFIERS BASED ON COLUMN ADDRESS OF COUNTER.

FIG. 6B  STG2: LATCH WORD DATA INTO I/O REGISTER AND OUTPUT DATA VIA I/O BUFFER.

FIG. 8A STG21: · SELECT WORD PAIR FROM SENSE AMPLIFIER
· LATCH WORD PAIR AT REGISTER (52) AND PERFORM ECC DECODING PROCESSING

FIG. 8B STG22: SELECT 1 WORD OUTPUT FROM WORD PAIR AFTER ECC DECODING

FIG. 8C STG23: LATCH WORD DATA AT OUTPUT REGISTER (53) AND OUTPUT DATA VIA IO BUFFER

FIG. 8D STG24: · LATCH WORD PAIR AT INPUT REGISTER (54)
· ECC ENCODING PROCESSING
· WRITE BACK WORD PAIR INTO SENSE AMPLIFIERS

FIG. 8E

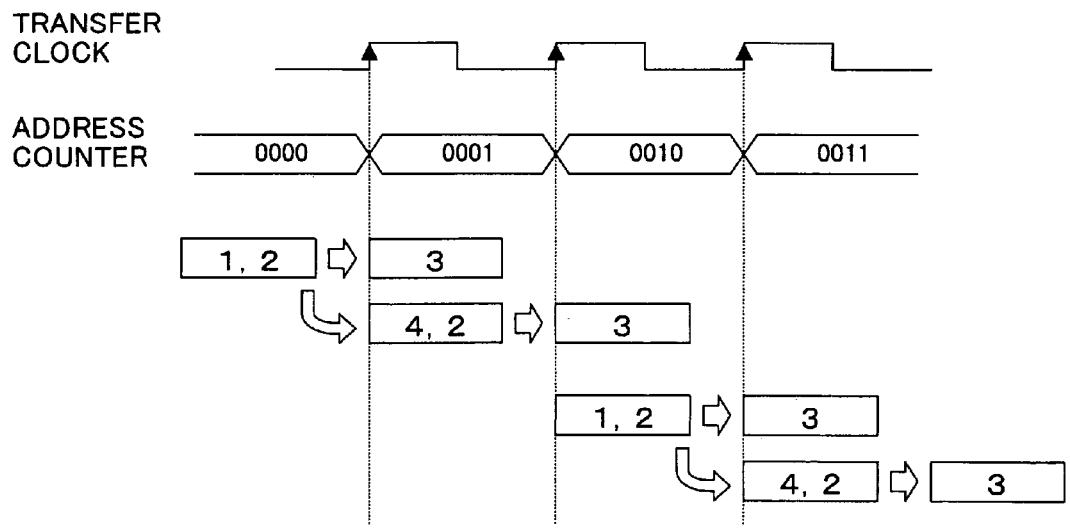

FIG. 9A STG31: · SELECT WORD PAIR FROM SENSE AMPLIFIER
· LATCH WORD PAIR AT REGISTER (52) AND PERFORM ECC DECODING PROCESSING

FIG. 9B STG32: LATCH PREDETERMINED WORD AT INPUT REGISTER (54) BASED ON COLUMN ADDRESS OF COUNTER

FIG. 9C STG33: · ECC ENCODING PROCESSING
· WRITE BACK WORD PAIR INTO SENSE AMPLIFIERS

FERROELECTRIC MEMORY CAPABLE OF CONTINUOUSLY FAST TRANSFERRING DATA WORDS IN A PIPELINE

CROSS REFERENCE TO RELATED APPLICATION

The present invention contains subject matter related to Japanese Patent Application No. 2005-240057 filed in the Japan Patent Office on Aug. 22, 2005, the entire contents of which being incorporated herein by reference.

BACKGROUND OF THE INVENTION

1. Field of the Invention

The present invention relates to a storage device including a ferroelectric memory, a file storage device, and a computer system, and, more particularly, relates to an improvement of the data transfer capability of a ferroelectric memory and use of such a ferroelectric memory to realize a high speed, high reliability file storage device.

2. Description of the Related Art

In recent years, a variety of semiconductor memories using new memory materials have been proposed. Many of these memories enable high speed random access irrespective of being novolatile. Application in the future as "next generation memories" is promising.

As a representative example thereof, a ferroelectric memory can be explained. The cell structure and operation of the ferroelectric memory becoming the mainstream at present were proposed by S. Sheffield et al. in U.S. Pat. No. 4,873,664.

FIG. 1 is a circuit diagram showing an example of the configuration of the ferroelectric memory disclosed in U.S. Pat. No. 4,873,664, etc.

In this ferroelectric memory 10, a memory cell is configured by one access transistor 11 and one ferroelectric capacitor 12. Two values, that is, 1 bit, are stored according to a polarization direction of the ferroelectric capacitor. Further, in FIG. 1, BL11 and BL12 indicate bit lines, WL11 indicates a word line, PL11 indicates a plate line, 13 indicates a word line decoder and driver (WLDD), 14 indicates a plate line decoder and driver (PLDD), and 15 indicates a sense amplifier (SA).

For example, in the ferroelectric memory 10, when the word line WL11 is selected and, further, a pulse is applied to the plate line PL11, a read signal appears at the bit line BL11 connected to a facing electrode of the ferroelectric capacitor 12 of the memory cell.

This situation will be explained with reference to a hysteresis curve of FIG. 2. In FIG. 2, the abscissa indicates a voltage applied to the ferroelectric capacitor, and the ordinate indicates an amount of polarization.

In an initial state of reading, the plate line PL11 and the bit line BL11 are equalized to 0V, and the bit line BL11 becomes a floating state. The ferroelectric capacitor 12 is polarized in different directions according to the stored data. For example, with "0", the state becomes "H0", and with "1", the state becomes (H1). Here, by applying a Vcc pulse to the plate line PL11, approximately Vcc is applied to both capacitors. Both of them shift to the state of (H2) together. Along with this, a signal difference corresponding to the difference of polarization displacements from the initial state appears at the bit line BL11 as a read signal difference of "0" and "1".

Namely, only at the time when the "1" data is stored and the state is "H1", the ferroelectric capacitor inverts in polarization, and a signal difference corresponding to the inversion appears at the bit line BL11. Specifically, the potential of the bit line BL11 becomes higher at the time of reading "1" with polarization inversion than that at the time of reading "0" without polarization inversion. Here, by supplying, for example, an intermediate potential of the "1" signal and the "0" signal as a reference signal and comparing the read signal and the reference signal by a differential type sense amplifier, it can be judged whether the above read signal is "1" or "0". Further, the above ferroelectric memory sometimes stores 1 bit by using two memory cells complementarily storing the data. In such a format, complementary data are read out from the memory cells to a bit line pair connected to the sense amplifier, and the difference of these signals is judged at the sense amplifier by comparison. Accordingly, it is not necessary to separately generate the reference potential.

Note that, at the time of such a read operation, the data of the capacitor in the memory cell is destroyed once. Accordingly, at the time of the end of access, it is necessary to write back the data read out to the sense amplifier to the memory cell again. In this case, in a state where the signal amplified at the sense amplifier is transmitted to the bit line BL11, a pulse is applied to the plate line PL11 and a voltage is given between the facing electrodes of the capacitor 12 thereby to polarize the ferroelectric film again.

Further, Japanese Patent Publication (A) No. 2002-197857 and Japanese Patent Publication (A) No. 09-121032 or Japanese Patent Publication (A) No. 2002-197857 propose cross point type ferroelectric memories as a means for further improving the degree of integration of the above ferroelectric memory. These are the same as the ferroelectric memory described above in the point of storing two values by the polarization direction of the ferroelectric capacitor and selecting a memory cell selection by the word line and the plate line and therefore can be regarded as modifications of that memory.

The polarization inversion of such a ferroelectric capacitor can be executed at a high speed of about several nanoseconds. Accordingly, a ferroelectric memory can realize a random access speed near that of a SRAM or a DRAM irrespective of being nonvolatile.

FIG. 3 is a block diagram for explaining the access routine at a memory chip level of a ferroelectric memory.

A memory chip 20 of FIG. 3 includes a row decoder 21, an address register 22, a memory cell array 23, sense amplifiers 24, a column selector 25, and an input/output (I/O) buffer 26.

Basically the ferroelectric memory chip 20 is accessed according to the following three steps.

Step <1>

A word line and a plate line are selected from the row address, and the memory cell data is read out to the sense amplifiers.

Step <2>

The sense amplifiers are selected from the column address and the data is input/output.

Step <3>

The data is rewritten in the memory cells from the sense amplifiers.

This will be explained in further detail.

Step <1>

A row address among the addresses input from the outside and stored in the address register 22 is input to the row decoder 21, and a word line and a plate line are selected from the memory cell array 23. 16 words (256 bits) worth of data selected from this combination and read out as explained above are decided on and latched at the sense amplifiers 24.

Step <2>

A column address among the addresses stored in the address register 22 is input to the column selector 25, and 1 word (16 bits) of corresponding sense amplifiers are selected from the sense amplifiers 24. At the time of a read operation, the data of the sense amplifiers is output via the I/O buffer 26, while at the time of a write operation, the data of the sense amplifiers is updated to the data input from the outside via the I/O buffer 26.

Step <3>

The data of the sense amplifiers 24 is written back into the read memory cells selected at step <1>.

Usually, about 5 nanoseconds are necessary in order to sufficiently judge polarization of a ferroelectric capacitor. Further, when considering the input of an address and decoding thereof, a cell array operation and sensing, the transfer of internal data, the drive of an external load by the buffer at the time of the data output, and so on, for example, 35 nanoseconds become necessary for step <1>, 15 nanoseconds become necessary for the output of step <2>, and about 15 nanoseconds become necessary for step <3>. After passing about 65 nanoseconds, the random access with respect to 1 word of the memory chip 20 is completed.

Further, in the case of a ferroelectric memory, the ferroelectric film is polycrystalline, and therefore the polarization characteristic varies quite a bit. As a technique for substantially reducing the influence of such variations and improving the operating margin, an introduction of an error correction code (ECC) is effective.

When correcting error inside the chip, in order to decrease the relative number of parity bits, often a plurality of words are used as units, for example, units of 32 bits. In that case, it is necessary to serially execute the decoding and the encoding of the data in the above step <2>. Accordingly, the time taken by step <2> becomes further longer.

FIG. 4 is a block diagram for explaining the access routine at the memory chip level of a ferroelectric memory introducing error correction code (ECC).

A memory chip 20A of FIG. 4 includes the row decoder 21, the address register 22, the memory cell array 23, the sense amplifiers 24, the column selector 25, and the input/output (I/O) buffer 26 of FIG. 3 plus a second column selector 27, an I/O register 28, an ECC decoder 29, and an ECC encoder 30.

The ferroelectric memory chip 20A of FIG. 4 is accessed by the following three steps. Note that the operations of step <1> and step <3> are the same as in the case of FIG. 3.

Step <1>

A row address among the addresses input from the outside and stored in the address register 22 is input to the row decoder 21, and a word line and a plate line are selected from the memory cell array 23. 16 words (256 bits+42 bits) worth of data of the memory cells selected from this combination and read out as explained above are decided on and latched at the sense amplifiers 24.

Step <2>

The higher bits of the column address among the addresses stored in the address register 22 are input to the column selector 25 and decoded, and 2 words' worth (32+6 bits) of corresponding sense amplifiers are selected from the sense amplifiers 24. The data is decoded at the ECC decoder 29, corrected for error, and then latched at the I/O register 28. Further, the lower bits of the column address are input to the column selector 27, and 1 word (16 bits) is selected from the register 28. At the time of a read operation, that value is output via the I/O buffer 26. On the other hand, at the time of a write operation, that value is rewritten, further encoded at the ECC encoder 30, and written back to the original locations of the sense amplifiers 24.

Step <3>

The data of the sense amplifiers 24 is written back to the read memory cells selected at step <1>.

In the above case, for step <2>, the processing of encoding or decoding is serially added. Further, for at least the write operation, the work of rewriting a portion of data once read out from the sense amplifiers 24 and further writing back the same into the sense amplifiers 24 becomes necessary. Due to this, for step <2>, a time of 5 nanoseconds to 10 nanoseconds is further taken.

Accordingly, after approximately 70 to 75 nanoseconds for steps <1> to <3>, random access with respect to one word of the memory chip 20A is completed.

SUMMARY OF THE INVENTION

As explained above, although the ferroelectric memory is nonvolatile, high speed random access can be realized. However, in recent semiconductor memories, there is a tendency for greater importance to be attached to not only random access, but also the transfer capability when handling continuous data groups. For example, in a system having a cache memory inside an MPU, the data in the system memory is accessed in a unit of lines. In this case, continuous data of, for example, 256 bits (32 bytes) are accessed all together. In the case where 1 word is formed by 16 bits, how fast the continuous 16 words are transferred becomes important.

In particular, the applicant is looking into ferroelectric memories as nonvolatile caches for the purpose of file storage. Details thereof are disclosed in Japanese Patent Publication (A) No. 2005-115857. By using a ferroelectric memory as a cache memory for file storage using a flash memory or a hard disk as the main medium, the access performance of the storage device can be improved while maintaining a strong durability against power interruptions.

For example, various types of detachable nonvolatile memory cards using flash memories as the main medium are being marketed for digital still cameras, etc. at the present time. However, irrespective of their being insufficient in terms of access performance, they do not have caches inside them for dealing with power interruption along with sudden removal. The same sort of situation occurs in all digital consumer electronics when their plugs are suddenly pulled out.

In recent years, in digital consumer electronics, hard disks or flash memories are being used in order to store user data and applications. Ferroelectric memories, which are high speed and nonvolatile, are promising as the cache memories for such file storage.

In such applications, the minimum unit of configuring a file, that is, a "sector", becomes the access unit. This is formed by, for example, 512 bytes. Accordingly, in a memory in which 1 word has a 16-bit length, the total transfer time in units of continuous 256 words determines the performance. As a result, the transfer performance of continuous data dominates the performance more than the random access performance.

However, in the above ferroelectric memory, no measures for improving the transfer capability when transferring such continuous data were studied. Namely, each time accessing a word, it was necessary to execute the following steps, and therefore 70 to 80 nanoseconds were taken for the transfer of 1 word.

Step <1>

A word line and a plate line are selected from the row address, and the memory cell data is read out to the sense amplifiers.

Step <2>

The sense amplifiers are selected from the column address and the data is input/output.

Step <3>

Data is rewritten from the sense amplifiers into the memory cells.

In this case, with, for example, a 16-bit IO memory chip, only about 25M to 30 M bytes per second can be transferred. Even when such a memory chip is used as the cache memory for file storage, therefore, only insufficient performance can be obtained.

It is therefore desirable in the present invention to improve the data transfer capability of a ferroelectric memory and provide a high speed, high reliability semiconductor memory device, file storage device, and computer system using such a ferroelectric memory.

According to a first embodiment of the present invention, there is provided a storage device having: a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film; sense amplifiers connected to the bit lines and selected by a column address; an internal counter able to generate the column address; and a control part configured to control a data access, wherein the control part accesses data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processsing using the column address generated in the internal counter for a group of words read out to the sense amplifiers at the first processing.

According to a second embodiment of the present invention, there is provided a file storage device using a ferroelectric memory as a cache memory and using a hard disk or a flash memory as a main storage medium, the ferroelectric memory having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by the column address, an internal counter able to generate the column address, and a control part configured to control a data access, wherein the control part accesses data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processsing using the column address generated in the internal counter for a group of words read out to the sense amplifiers at the first processing.

According to a third embodiment of the present invention, there is provided a computer system having a system memory and a processing unit for transferring data with the memory system, in which the system memory includes a ferroelectric memory, the ferroelectric memory having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by the column address, an internal counter able to generate the column address, and a control configured to control a data access, wherein the control part accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processsing using the column address generated in the internal counter for a group of words read out to the sense amplifiers at the first processing.

According to a fourth embodiment of the present invention, there is provided a computer system having a system memory, a processing unit configured to transfer a data with the memory system through a system bus, and a file storage device connected with the system bus through an interface circuit and including a cache memory, at least one of the system memory and the cache memory of the file storage device including a ferroelectric memory, having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by the column address, an internal counter able to generate the column address, and a control part controlling data access, wherein the control part accesses data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processsing using the column address generated in the internal counter for a group of words read out to the sense amplifiers at the first processing.

BRIEF DESCRIPTION OF THE DRAWINGS

These and other objects and features of the present invention will become clearer from the following description of the preferred embodiments given with reference to the attached drawings, wherein:

FIGS. 6A to 6C are diagrams summarizing a pipeline operation according to the first embodiment;

FIGS. 8A to 8E are diagrams summarizing a pipeline operation according to the second embodiment;

FIGS. 9A to 9D are diagrams summarizing write transfer processing according to the second embodiment;

DESCRIPTION OF THE PREFERRED EMBODIMENTS

Below, preferred embodiments of the present invention will be explained with reference to the drawings.

Figure 1:
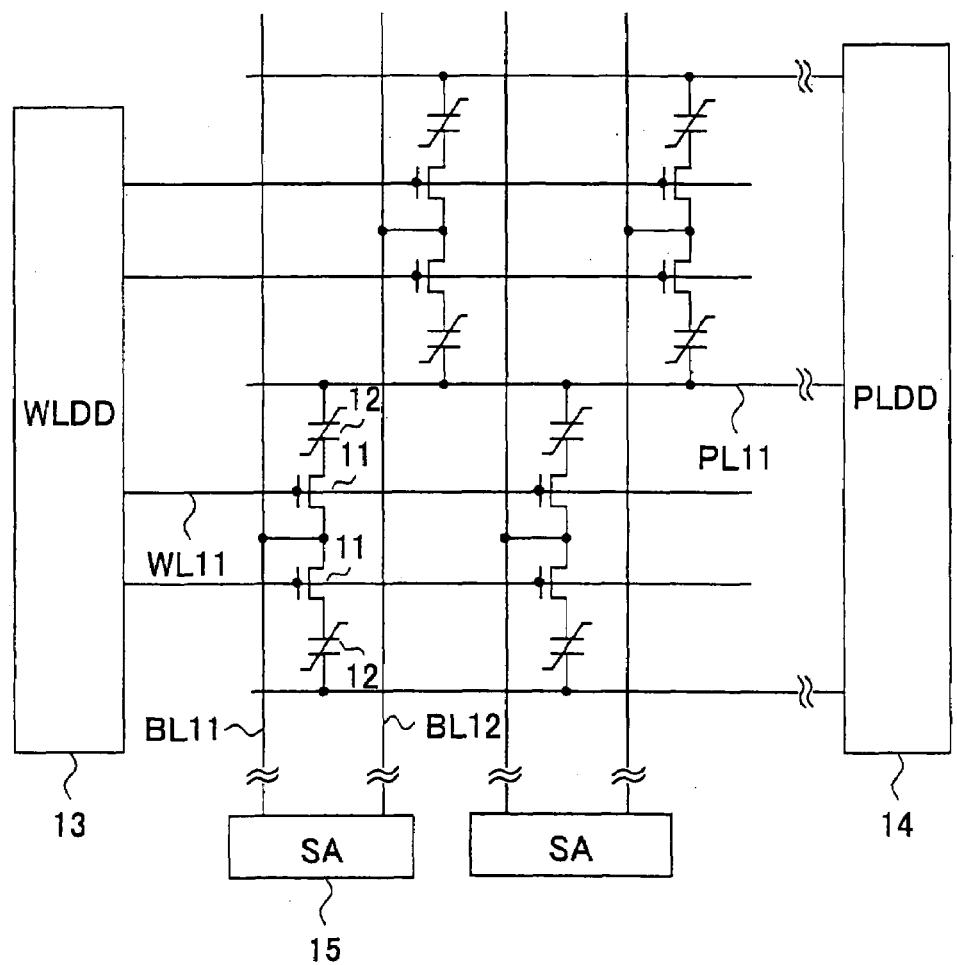
FIG. 1 is a circuit diagram showing an example of the configuration of a ferroelectric memory.
Figure 2:
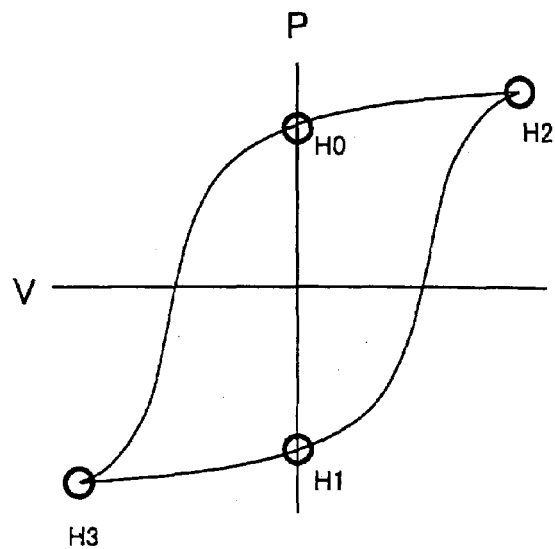
FIG. 2 is a diagram showing a hysteresis curve for explaining the principle of operation of a ferroelectric memory.
Figure 3:
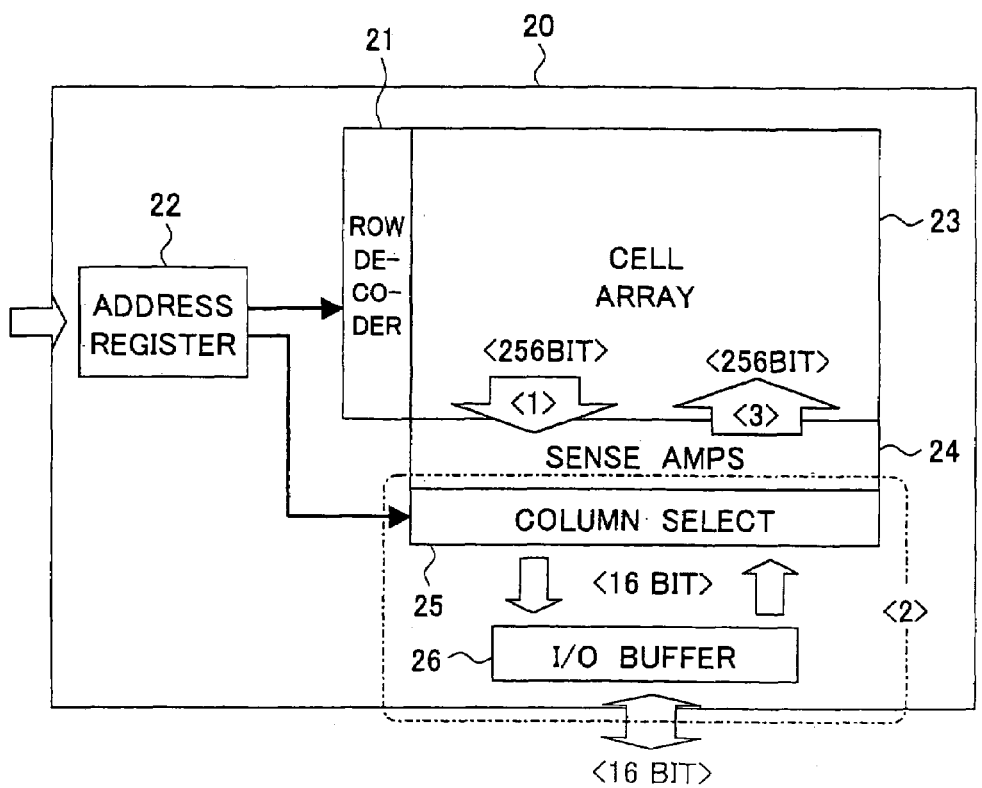
FIG. 3 is a block diagram for explaining an access routine at a memory chip level of a ferroelectric memory.
Figure 4:
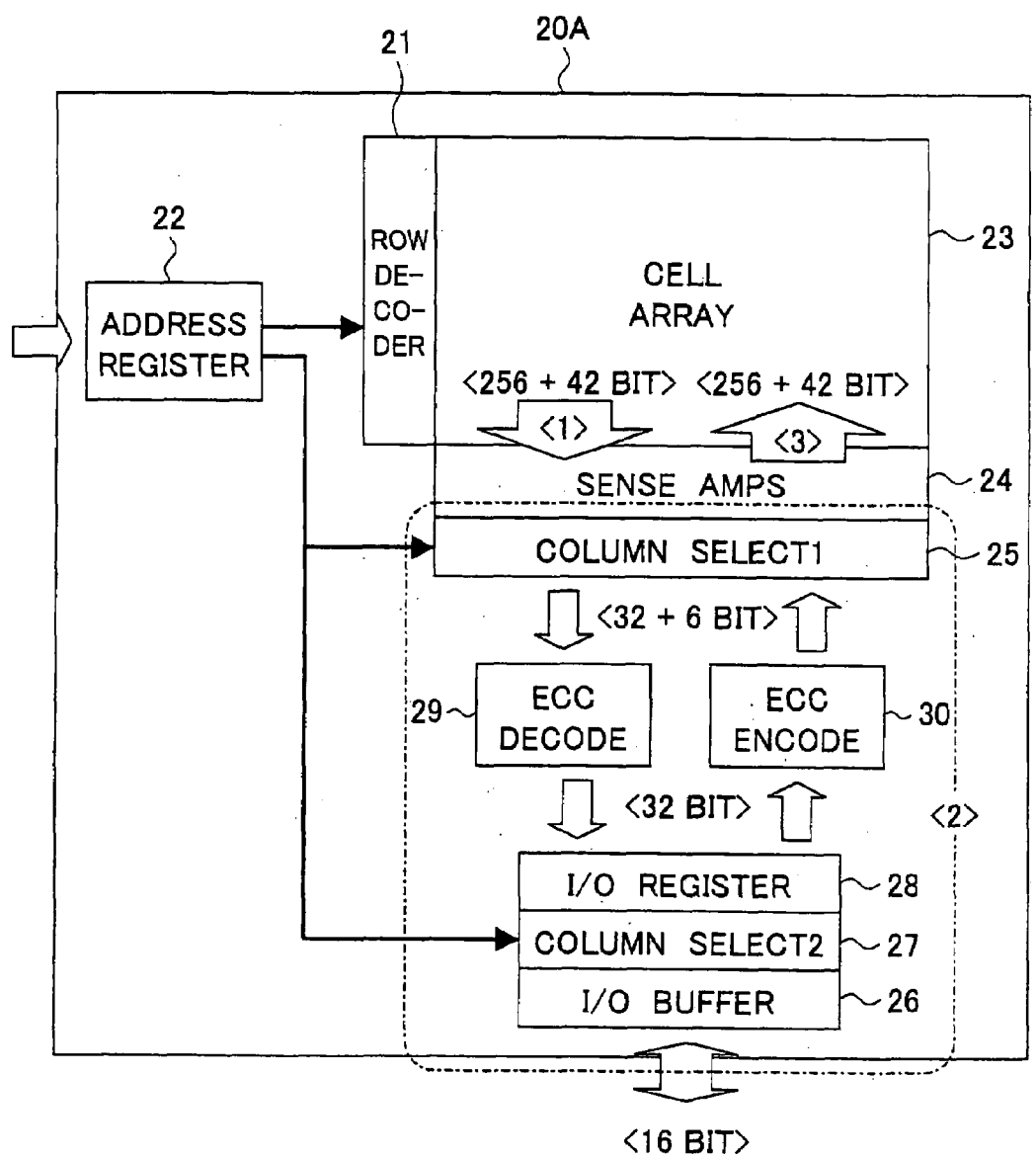
FIG. 4 is a block diagram for explaining an access routine at a memory chip level of a ferroelectric memory introducing an error correction code (ECC)
Figure 5:
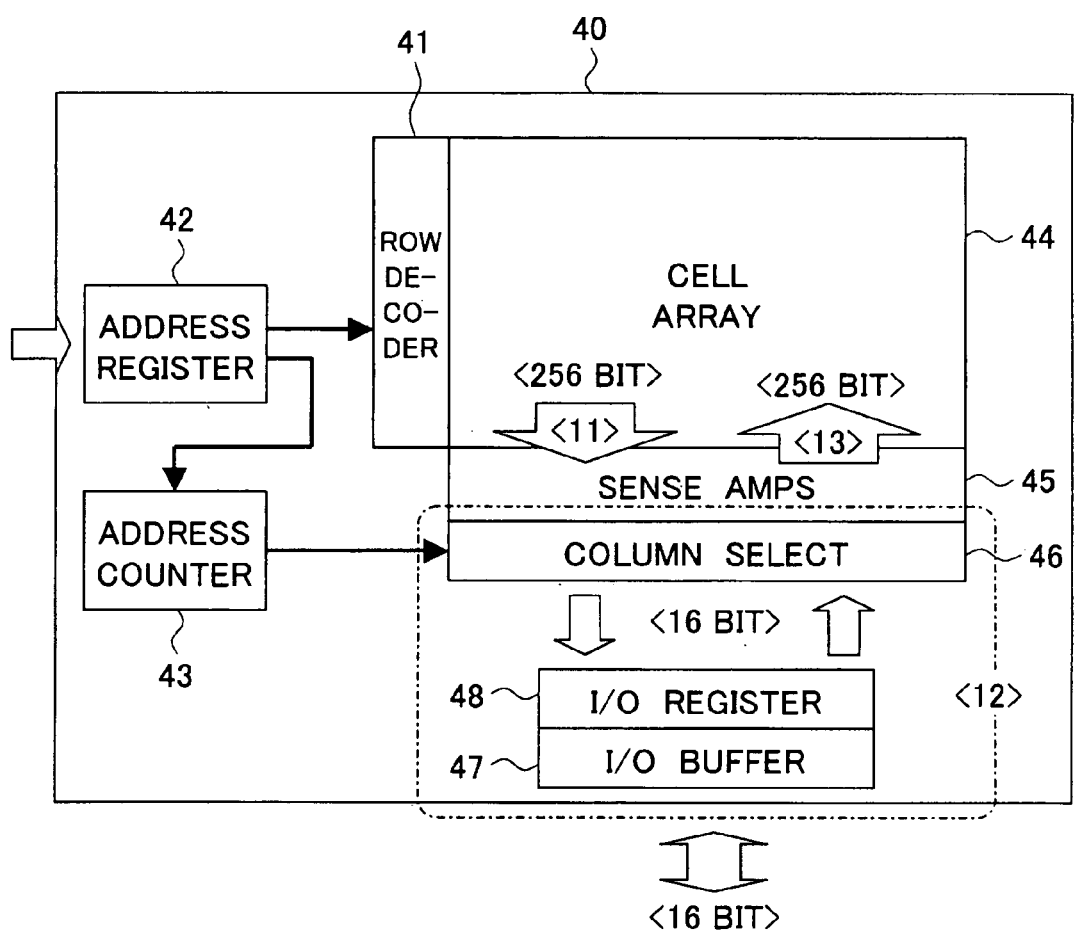
FIG. 5 is a block diagram showing a ferroelectric memory (semiconductor memory device) according to a first embodiment of the present invention.

FIG. 5 is a block diagram showing a ferroelectric memory (semiconductor memory device) according to a first embodiment of the present invention.

A ferroelectric memory chip 40 of FIG. 5 includes a row decoder 41, an address register 42, an address counter 43, memory cell array 44, a sense amplifiers 45, a column selector 46, an input/output (I/O) buffer 47, and an I/O register 48.

In the erroelectric memory chip 40, a mechanism of transferring continuous word data at a high speed is newly added to the ferroelectric memory of the related art.

Namely, in contrast to the access-routine of the ferroelectric memory of the already proposed related art of step <1> where a word line and a plate line are selected from the row address and the memory cell data is read out to the sense amplifiers, step <2> where the sense amplifiers are selected from the column address and the data is input/output, and step <3> where data is rewritten from the sense amplifiers into the memory cells, the present embodiment has the following function. In the present embodiment, provision is made for a mechanism for continuously transferring data formed by a plurality of words read out at a first step (first processing) <11> all together by using the internal address counter 43 in a second step (second processing) <12>. Further, a third step (third processing) <13> need to be executed only once as post-processing after the end of transfer of a plurality of words.

Below, details of the access routine of a ferroelectric memory of the first embodiment will be explained.

First Step <11>

A row address among addresses input from the outside and stored in the address register 42 is input to the row decoder 41, and a word line and a plate line are selected from the memory cell array 44. 16 words' (256 bits) worth of data of the memory cells selected from this combination and read out as previously explained is determined and latched at the sense amplifiers 45.

Second Step <12>

The 16 words (256 bits) of data stored in the sense amplifiers 45 are continuously accessed as follows. First, a column address among addresses stored in the address register 42 is input to the 4-bit internal address counter 43, whereupon the counter is set at the same value. Further, according to the output thereof, a corresponding 1 word (16 bits) of sense amplifiers are selected from the sense amplifiers 45. In the case of a read operation, a state where the data stored in the selected word of sense amplifiers at this point of time reaches immediately before the I/O register 48 is exhibited.

By receiving a transfer clock input from the outside here, this word data is latched into the I/O register 48, and the value thereof is output via the I/O buffer 47 to the outside. Simultaneously with that, the address counter 42 is incremented, whereby the next column address is generated. The generated column address is input to the column selector 46 and decoded, and the next 1 word (16-bits) is selected from the sense amplifiers 45. The state where the data stored in the corresponding sense amplifiers reaches immediately before the I/O register 48 is exhibited.

The above operation is repeated according to need. For example, when it is repeated 16 times, this means that all word data read out to the sense amplifiers are output and transferred. At this time, the above second step is divided into the following two stages which are executed in parallel in a pipeline form.

First Stage STG1

The internal address counter 43 is incremented, and the word data is selected from the sense amplifiers 45 according to the generated column addresses.

Second Stage STG2

The word data is latched into the I/O register 48 and output to the outside via the I/O buffer 47.

Figure 6C:
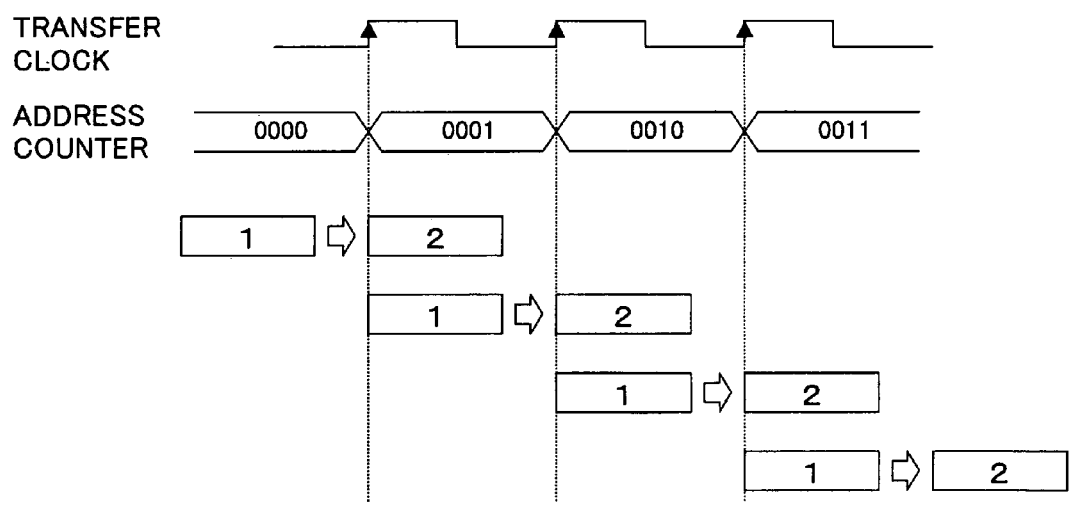

FIGS. 6A to 6C are diagrams summarizing the pipeline operation according to the first embodiment.

The processings executed at the stages STG1 and STG12 are small, and therefore these can be repeatedly executed in a cycle of 10 nanoseconds or less. Accordingly, 16 words' worth of the data can be output at an extremely high speed, and a high transfer performance can be acquired.

Third Step <13>

16 words (256 bits) of data stored in the sense amplifiers 45 is written back into the corresponding memory cells all together.

Note that, for a write operation in the memory of the present configuration, the first step <11> and the third step <13> are executed in the same way as the read operation. On the other hand, at the second step <12>, continuous writing of 16 words (256 bits) stored in the sense amplifiers 45 is executed in one stage as follows.

After the processing of the first step <11>, first, in the same way as the time of the read operation, the initial address is set in the address counter 43, the output thereof is input to the column selector 46, and the corresponding one word (16 bits) is selected from the sense amplifiers 45. At this time, the input data is simultaneously latched in the I/O register 48. This reaches the selected sense amplifiers and rewrites the values thereof.

By the next transfer clock input from the outside, the next input data is latched in the I/O register 48. Simultaneously with that, the address counter 43 is incremented, and a next column address is generated. The generated column address is input to the column selector 46 and decoded, and the next 1 word (16 bits) is selected from the sense amplifiers 45. Due to this, the sense amplifiers corresponding to the next word are rewritten.

Note that, at the above continuous write operations, desirably, the timing is adjusted so as to insert a delay in the data transfer from the I/O register 48 to the column selector 46 so that the next data is not erroneously written into the previous sense amplifier.

In the ferroelectric memory, however, when reading data to the sense amplifiers by the processing of the first step <11> described above, the data in the selected cells is destroyed. Accordingly, when the power drops due to some sort of trouble, such as a blackout during the period of continuous access in the processing of the second step <12>, the data in the sense amplifiers also disappears, so it becomes impossible to recover the data of the selected cells. This is inconvenient for the nonvolatile memory. Accordingly, desirable, provision is made of a protection function monitoring a power level at least during the period when the processing of the second step <12> is executed and, when detecting a drop of the power level, interrupting the processing of the second step <12> and immediately executing the processing of the third step <13>.

Figure 7:
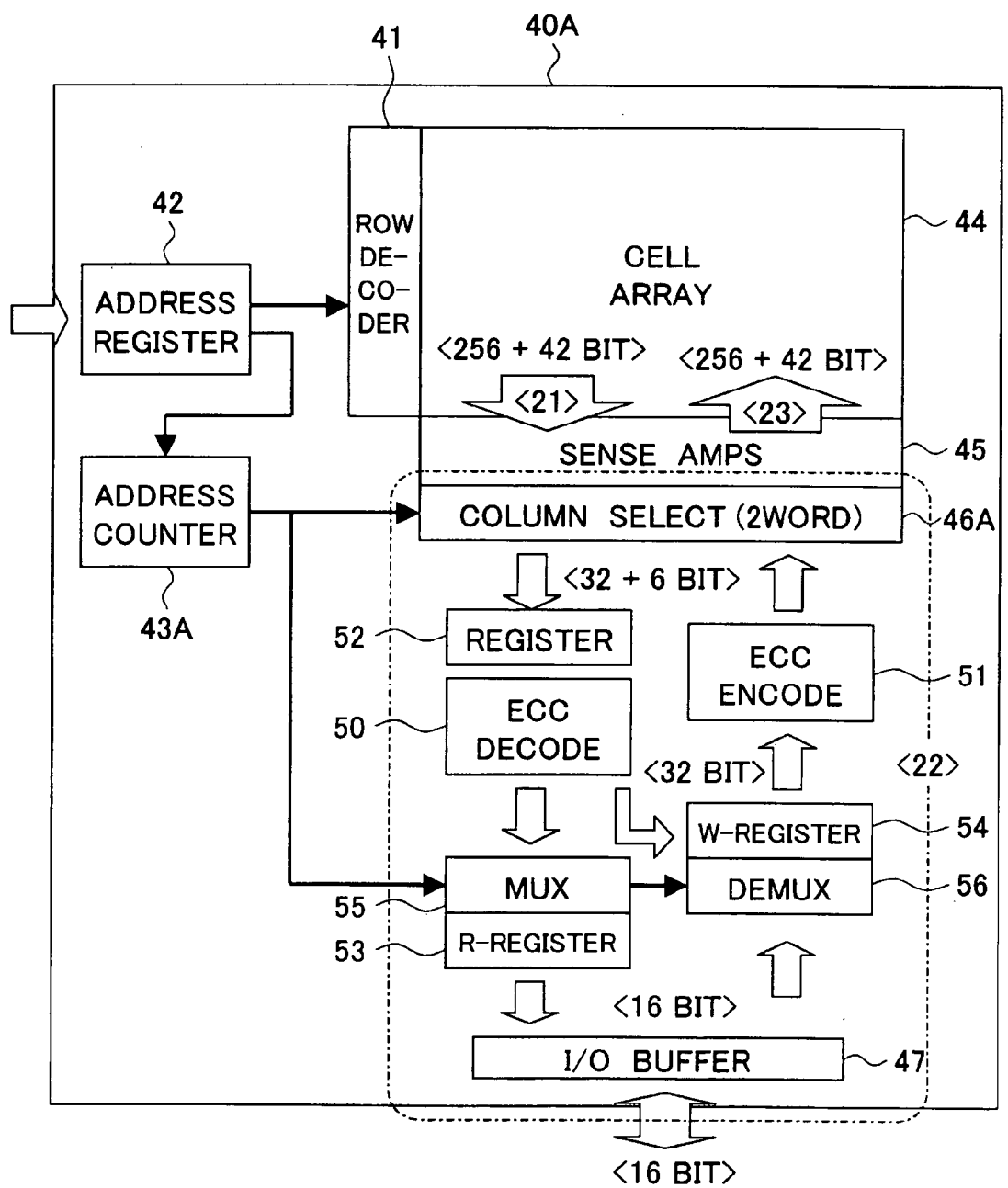
FIG. 7 is a block diagram showing a ferroelectric memory (semiconductor memory device) according to a second embodiment of the present invention.
Figure 9D:
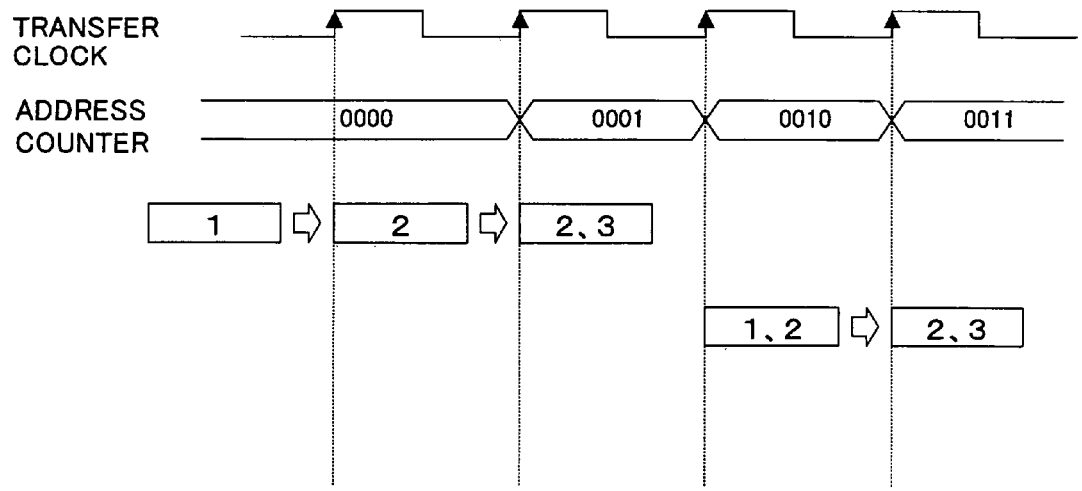

FIG. 7 is a block diagram showing a ferroelectric memory (semiconductor memory device) according to a second embodiment of the present invention. FIG. 7 shows an example of introducing ECC error correction to an embodiment of the present invention. Here, high speed data transfer is executed while applying the error correction processing in units of 32 bits (2 words) at the time of the input/output of data.

A ferroelectric memory chip 40A of FIG. 7 includes a row decoder 41, an address register 42, a address counter 43A, a memory cell array 44, a sense amplifiers 45, a column selector 46A, an input/output (I/O) buffer 47, an ECC decoder 50, an ECC encoder 51, a register 52, an output register 53, an input register 54, a multiplexer (MUX) 55, and a demultiplexer (DeMUX) 56 of FIG. 5.

In the present example as well, rather than the processing of the basic access routine of step <1> where a word line and a plate line are selected from the row address and the memory cell data is read out to the sense amplifiers, step <2> where the sense amplifiers are selected from the column address and the data is input/output, and step <3> where data is rewritten from the sense amplifiers into the memory cells, the present embodiment has the following function. Namely, in the second embodiment, the plurality of words of data read out in the processing of the first step <21> is continuously transferred all together by using the internal address counter 43 in the processing of the second step <22>. Thereafter, the processing of the third step <23> is executed only one time as the post-processing after the end of the transfer of a plurality of words.

Further, in the second embodiment, the ECC error correction processing is added in the processing of the second step <22>. The addition of such processing leads to an increase of the processing amount in the second step <22>, but by dividing the internal processing into a plurality of stages and forming a pipeline, high speed data transfer becomes possible.

Details of an access routine will be explained below.

First Step <21>

A row address among addresses input from the outside and stored in the address register 42 is input to the row decoder 41, and a word line and a plate line are selected from the memory cell array 44. 16 words' (256 bits+42 bits) worth of data of the memory cells selected from this combination and read out as previously explained is determined and latched at the sense amplifiers 45.

Second Step <22>

The 16 words (256 bits) of data stored in the sense amplifiers 45 are continuously accessed as follows. First, a column address among addresses stored in the address register 42 is input to the 4-bit internal address counter 43A, whereupon the address counter 43A is set at the same value. The higher bits in the output value of the address counter 43A are input to the column selector 46A and decoded, whereupon the corresponding 2 words' worth (32+6 bits) of sense amplifiers are selected from the sense amplifiers 45.

Note that, in the present embodiment, the data of the sense amplifiers 45 are selected via the column selector 46A and input or output two words at a time, but during continuous transfer, these data input and output are alternately executed.

Namely, in the read operation, two selected words are latched at the register 52, processed once for error correction by ECC via the decoder (decoding circuit) 50, and then sent to the output register 53 and output, but these are also simultaneously transferred to the input register 54. Then, they are encoded by the ECC encoder (encoding circuit) 51 again and then written back into the sense amplifiers 45. Namely, in the cycle of outputting the two words described above, one read operation and one write operation with respect to the sense amplifiers 45 are executed.

Such processing is effective particularly for recovery from defects in data storage. For example, the cell data which becomes defective due to the deterioration of the amount of polarization during data storage is read out in this way for error correction by the ECC circuit, whereby it is restored to normal, and then is written back into the memory cell.

In the data transfer at the time of a read operation, the word data stored in the selected sense amplifier is immediately latched to the register 52 and is corrected for error by the ECC decoder 50. Further, one word is selected from two words by the multiplexer 55. Thereafter, when a transfer clock is input from the outside, this word is latched at the output register 53 and output to the outside via the I/O buffer 47. Further, in synchronization with the clock, the address counter 43 is simultaneously incremented, whereby the multiplexer 55 selects the other word. Further, the read out word pair is latched at the input register 54 synchronously and in parallel. These words are encoded at the ECC encoder 51 again and written back into the sense amplifiers 45 as they are via the column selector 46A.

When the next transfer clock is input, the next word is latched at the output register 53 and output to the outside via the I/O buffer 47. The address counter 47A is simultaneously incremented. This indicates the address of the next word pair, and therefore the word pair newly selected from the sense amplifiers 45 is output via the column selector 46A, immediately latched at the register 52, and corrected for error by the ECC decoder 50.

In this way, for each transfer clock, output access and input access in units of 2 words are alternately repeated without interruption with respect to the sense amplifiers 45.

Then, simultaneously with that, according to the column addresses generated by the internal address counter 43A, selected words are latched at the output register one by one and output and transferred to the outside of the storage device.

Namely, these operations are performed in parallel at a high speed by pipeline processing.

FIGS. 8A to 8E are diagrams summarizing the pipeline processing according to the second embodiment.

This pipeline processing includes four processing stages STG21 to STG24.

First Stage STG21

A word pair is selected from the sense amplifiers 45, and the word pair is latched at the register 52 and processed by ECC decoding.

Second Stage STG22

The word pair to be output is selected from among word pairs after the ECC decoding.

Third Stage STG23

The word data is latched at the output register 52, and the data is output via the I/O buffer 47.

Fourth Stage STG24

The word pair is latched at the input register 54, processed by ECC encoding, and then written back into the sense amplifiers 45.

Third Step <23>

16 words (256 bits) of data stored in the sense amplifiers 45 are written back into the corresponding memory cells all together.

In the method of the present embodiment of continuously transferring a plurality of words by using column addresses generated in an internal counter in this way, the first step <21> and the third step <23> need to be carried out only once for the transfer of a plurality of words. Further, for the second step <22> as well, as shown in FIGS. 8A to 8E, the decoding of the first stage STG21 and the encoding of the fourth stage STG24 need to be carried out only once for the output of two words. Further, the internal portion can be configured for pipeline processing, and therefore the execution cycle can be greatly shortened. By combining such an effect, the ferroelectric memory of the second embodiment is dramatically improved in its data transfer capability.

On the other hand, for the data transfer at the time of a write operation, the processings of the first step <21> and the third step <23> are the same, but the second step <22> is executed in, for example, the following way.

First, among the addresses stored in the address register 42, the column address is input to the 4-bit internal address counter 43A, whereby the address counter 43A is set at the same value. Among the output values of the address counter 43A, the higher bits are input to the column selector 46A and decoded, and the corresponding 2 words' worth (32+6 bits) of sense amplifiers are selected from the sense amplifiers 45. The two words of data described above are immediately latched at the register 52 and corrected for error by the ECC decoder 50. These word pairs are data prepared so that encoding in units of two words can be normally executed even in a case where, for example, the needed data input is completed by the writing of only one word and the operation shifts to the third stage <23> as it is.

In synchronization with the transfer clock from the outside, the word data input from the outside is stored at a suitable location in the input register 54. The input register 54 has two words' worth of capacity. In the selection of the storage location, the corresponding side is determined by the demultiplexer 56 according to the column address of the counter.

By the next transfer clock, the address counter 43A is incremented. Along with this, according to the column address generated there, the next word data input from the outside is stored at a suitable location of the input register 54. When the input register 54 is filled with new input data, these are processed for encoding by the ECC encoder 51 and written back into the sense amplifiers 45.

Further, when the address counter 43A is incremented by the next transfer clock, the generated column address designates the next word pair in the sense amplifiers 45. At this time, the following operations are executed in parallel.

First, the corresponding next two words' worth (32+6 bits) of the sense amplifiers are selected by the column selector 46A. The data thereof is immediately latched at the register 52 and corrected for error by the ECC decoder 50. In parallel with this, the next word data input from the outside is stored at a suitable location of the input register 54.

After that, the same write operation is repeated. In the same way as the read operation, at the write/transfer operation, the reading and writing of the word pair are alternately executed with respect to the sense amplifiers 45 for each transfer clock.

Note that, in the present embodiment, the write/transfer operation is not performed by pipeline processing.

FIGS. 9A to 9D are diagrams summarizing the write/transfer processing according to the second embodiment. This write/transfer processing includes the three stages STG31 to STG33.

First Stage STG31

A word pair is selected from the sense amplifiers 45, and the word pair is latched at the register 52 and processed by ECC decoding.

Second Stage STG32

The word pair to be processed is latched at the input register 54 based on the column address of the address counter 43A.

Third Stage STG33

The word pair is processed by ECC encoding and then written back into the sense amplifiers 45.

As shown in FIGS. 9A to 9D, in the write/transfer processing, the cycle of processing two words by two clocks (the processing of the stages STG31 and STG32 by the first clock and the processing of stages STG32 and STG33 by the next clock) is repeated in the future as well.

Note that when completing the transfer without filling the input register 54 with two words' worth of new input data at the time of a write operation, for example, when writing only one word, data which is read out from the sense amplifier and decoded is latched to the empty side of the input register 54 according to need. Due to this, when two words forming a pair are collected, these are processed for encoding by the ECC encoder 51 and written back into the sense amplifiers 45.

As explained above, the ferroelectric memory of the present embodiment has the function of transferring continuous word data at a high speed. Such a semiconductor memory is nonvolatile, yet it can access cache lines (up to 256 bits) or file sectors (up to 512 bytes), etc. at an extremely high speed.

Figure 10:
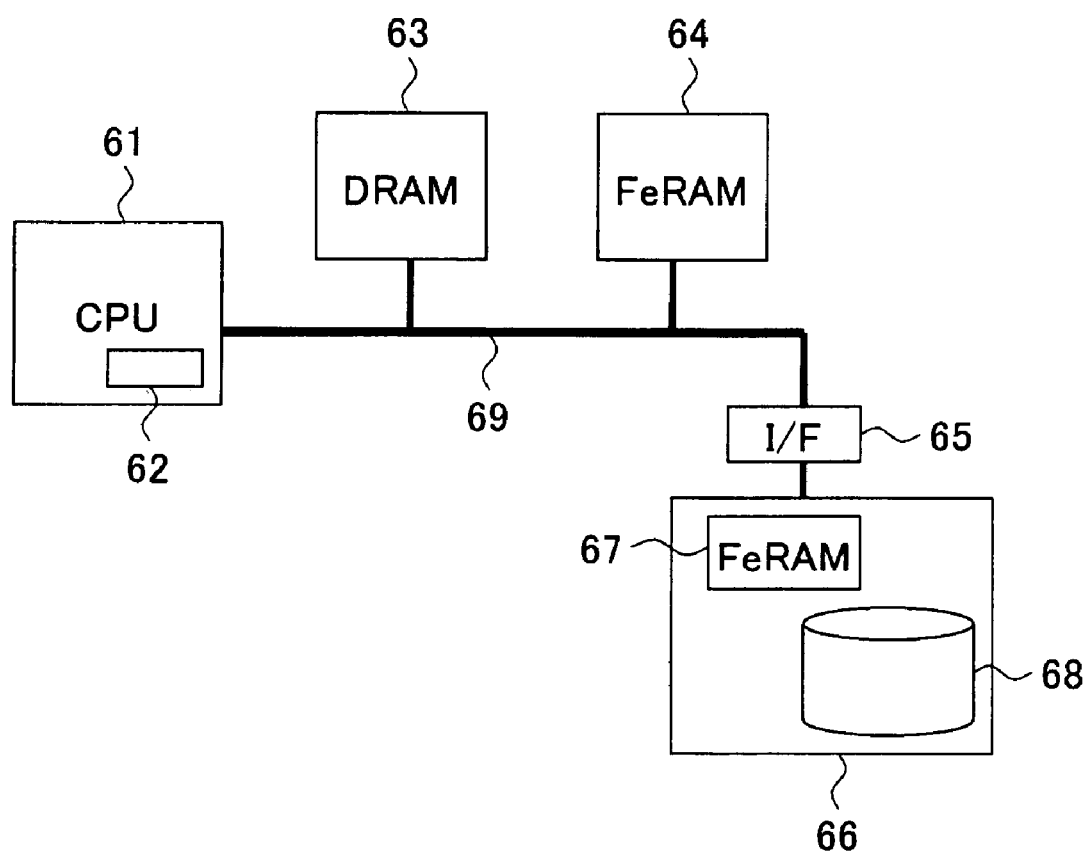
FIG. 10 is a diagram showing an example of the configuration of a computer system using the characteristics of the memory of the present embodiment.

FIG. 10 is a diagram showing an example of the configuration of a computer system utilizing the characteristics of a memory of the present embodiment.

A computer system 60 of FIG. 10 has a CPU 61, a cache memory 62, a system memories 63 and 64, an interface circuit 65, a hard disk drive 66, a ferroelectric memory (FeRAM) 67, a hard disk 68, and a system bus 69.

The CPU 61 has the cache memory 62 mounted therein. The CPU 61 transfers data in units of lines of 256 bits with the system memories 63 and 64 via the built-in cache memory 62.

The system memory 63 is configured by, for example, a DRAM, the system memory 64 is configured by ferroelectric memories (FeRAM) 40 and 40A according to embodiments of the present invention, and the memories 63 and 64 are connected to the system bus 69. The ferroelectric memory (FeRAM) 64 stores application programs, JAVA® applets, system settings, and part of the user data. The system memory 63 formed by the DRAM mainly provides a work area of the program. Such ferroelectric memory (FeRAM) 64 can easily handle frequent updating of programs and can start up and run programs at a high speed.

The hard disk drive 66 is connected via the interface circuit 65 to the system bus 69. The hard disk drive 66 has the ferroelectric memory (FeRAM) 67 configured by the ferroelectric memory (FeRAM) 40 or 40A according to the embodiments of the present invention built into it as the cache of the main storage medium formed by the hard disk 68.

The cache formed by the ferroelectric memory (FeRAM) 67 stores part of the user data to be stored inside the hard disk drive 66. The addresses corresponding to the data stored in the cache are managed by a not shown cache table in the ferroelectric memory 67. At the time of data access from the outside, this cache table is referred to. If data corresponding to the address to be accessed exists in the cache, the data in the cache is accessed.

In such file storage, usually, the data is accessed in units of sectors of 512 bytes or the like. A ferroelectric memory according to an embodiment of the present invention has a function enabling transfer of continuous word data at a high speed and is accessed without taking the seek time peculiar to a hard disk.

Accordingly, such a hard disk drive (HDD) can be accessed at a high speed. In addition, even when the power drops due to some unpredictable cause, the internal cache data will not disappear. Accordingly, the reliability of the HDD is greatly improved.

Note that the cache table also has to be stored at the time of a power interruption, so it is desirably constructed in an empty region in the ferroelectric memory (FeRAM) 67.

Figure 11:
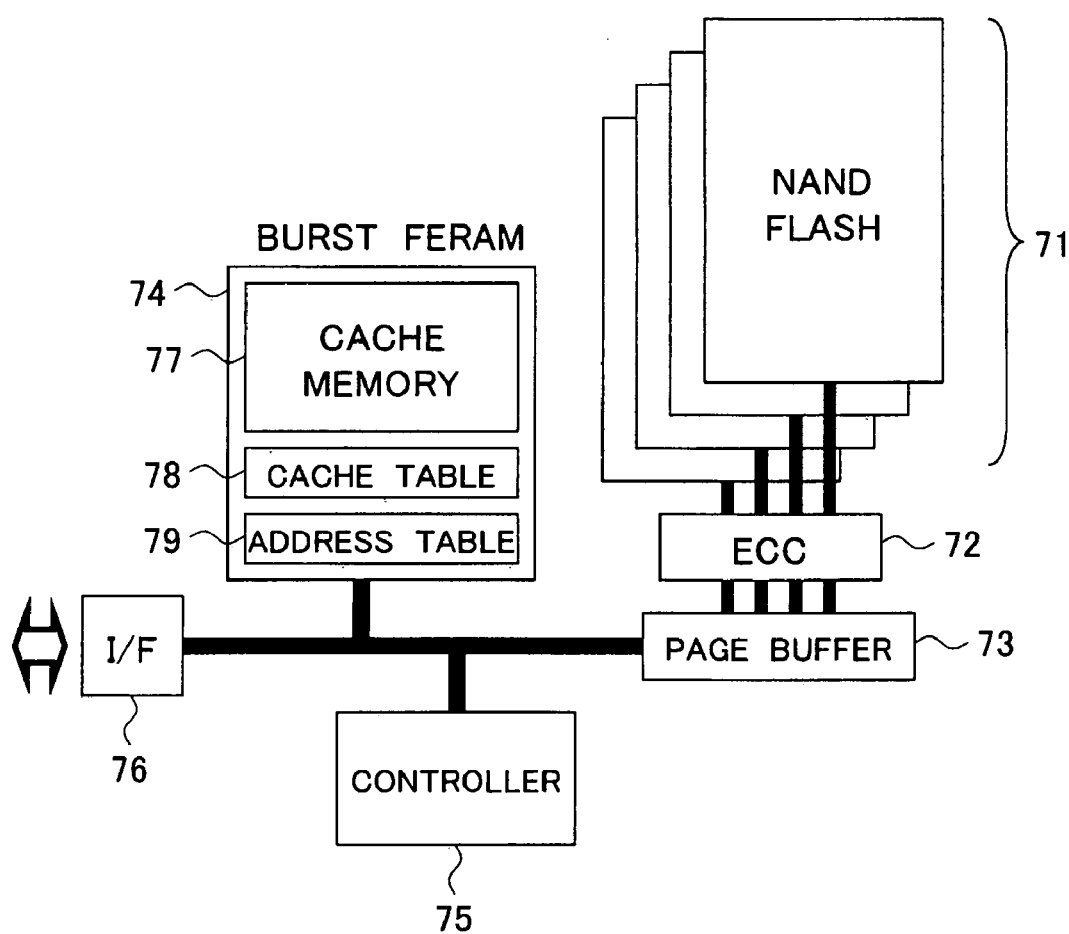
FIG. 11 is a diagram showing an example of the configuration of a file storage using a ferroelectric memory having a burst transfer function for a cache memory and using a NAND type flash memory for a main memory according to the present embodiment.

FIG. 11 is a diagram showing an example of the configuration of a file storage using a ferroelectric memory having a burst transfer function of the present embodiment for the cache memory and using a NAND type flash memory for the main memory.

A file storage 70 of FIG. 11 has a NAND type flash memory 71, an ECC circuit 72, a page buffer 73, a ferroelectric memory 74, a control circuit 75, and an interface circuit 76.

The interface circuit 76 with a host controller of the file storage 70 transfers the data with the host controller in units of sectors of 512 bytes or in units of a continuous plurality of sectors according to, for example ATA, PCI Express, USB, or other standard specifications.

The NAND type flash memory 71, configured by, for example, four chips, is connected to the page buffer 73 in parallel via the ECC circuit 72. At the time of a read operation of the data from the flash memory 71, groups of data each corresponding to, for example, 2 kB are continuously read out from the memory chips all together, decoded for the error correction by the ECC circuit 72, and stored in the page buffer 73. At the time of a write operation of the data into the flash memory 71, the data of the page buffer 73 is encoded by the ECC circuit 72 and written into the four chips of the NAND type flash memory 71 in parallel in the state where parity bits are given. In this way, the flash memory 71 is accessed via the page buffer 73.

On the other hand, the control circuit 75 controls the transfer of data between the interface circuit 76 and the page buffer 73 and the cache memory 77 constructed in the ferroelectric memory 74. At that time, the control circuit 75 stores at least a part of the data written from the user in the cache memory 77. Further, the control circuit 75 stores the information of the addresses corresponding to the stored data in the cache table 78 constructed in the same ferroelectric memory 74. At the time of access to data from the outside, the cache table 78 is referred to. If the data corresponding to the address to be accessed exists in the cache memory 77, the data in the cache memory is accessed. The ferroelectric memory 74 of the present embodiment has a function enabling transfer of continuous word data at a high speed. It may be accessed at a considerably higher speed than a flash memory. None of the erasing time peculiar to a flash memory is needed either.

Further, the control circuit 75 manages virtual addresses by using an address conversion table 79 constructed in the ferroelectric memory 74 in the same way. An input sector address is converted to a physical address for accessing the NAND type flash memory 71 with reference to the address conversion table 79. Due to this, it is possible to skip over defective blocks in the flash memory and optimize the write locations of the data.

Such a file storage 70 can be accessed at an extremely high speed. In addition, it is a mobile storage powered from the host system. Even if suddenly pulled out during operation, the cache data is stored in the nonvolatile ferroelectric memory and is not lost. Further, the cache table and the address conversion table are stored in the same memory, and therefore, when the power is turned on again, they can be easily restored to the original states. Accordingly, it is possible to secure a high reliability.

According to the embodiments of the present invention, by generating the column address of the ferroelectric memory by using an internal counter, it is possible to dramatically improve the transfer capability. Namely, the ferroelectric memory has a cell array structure resembling a DRAM. When a word line and a plate line are selected according to the row address, a plurality of words of data is read out to the sense amplifiers all together. Unlike other nonvolatile memories, no penetration current flows at the time of memory cell access, and therefore, at that time, it is possible to access memory cells equivalent to tens or more word data in parallel all together without being concerned about the peak current and read out the same to the sense amplifiers or write the same from the sense amplifiers. Namely, in principle, a single first step (first processing) is sufficient for the transfer of a large number of words.

Further, for the second step (second processing), rather than selecting the plurality of words read out to the sense amplifiers one by one by waiting for an address input from the outside, it is also possible to select them automatically by an address generated by the internal counter and thereby divide this step into a plurality of pipeline stages. Namely, by dividing the second step into pipeline stages and repeatedly executing the same, the cycle itself can be shortened. By this, it becomes possible to transfer the continuous data at a high speed. Further, even in the case where the error correction processing by ECC is further added, it is not necessary to execute the decoding and encoding for each word so far as the specification calls for inputting and outputting data for consecutive column addresses.

Further, for the third step (third processing), it is possible to stop writing data into the memory cells for each transfer cycle, like in the burst mode of an SRAM or a DRAM, and instead write a plurality of words of data stored in the sense amplifiers into the memory cells all together like at the first step.

By adopting the present invention, the transfer speed of the ferroelectric memory can be shortened to 10 nanoseconds or less per word. Namely, it is possible to improve the data transfer capability of the ferroelectric memory six-fold or more. Further, by using such a ferroelectric memory as a cache memory, it is possible to realize high speed file storage resistant to power interruptions. Further, when using such a ferroelectric memory in the system memory of a mobile device and mounting a CPU having a built-in cache, no power consumption is required for maintaining the memory content at the time of nonuse while maintaining a high processing capability, so the battery life can be extended.

It should be understood by those skilled in the art that various modifications, combinations, sub-combinations and alterations may occur depending on design requirements and other factors insofar as they are within the scope of the appended claims or the equivalents thereof.

What we claim is:

1. A storage device comprising:
    a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film;
    sense amplifiers connected to the bit lines and selected by a column address;
    an internal counter able to generate the column address; and
    a control part configured to control a data access, wherein the control part accesses the data by
    a first processing of reading out a plurality of words of data from memory cells of a word line and a plate line selected according to a row address and storing it in the sense amplifiers,
    a second processing of selecting sense amplifiers from the column address and inputting/outputting data with the outside, and
    a third processing of writing back the data of the sense amplifiers into the memory cells,
    with data being continuously input or output and transferred by repeatedly executing the second processing using the column address generated in the internal counter for a group of words read out to the sense amplifiers at the first processing.

2. A storage device as set forth in claim 1, wherein the control part performs the function of decoding the output data for error correction and encoding processing the input data at the second processing at the time of the data access.

3. The storage device as set forth in claim 1, wherein the internal counter supplies continuous column addresses,
    the second processing is divided into a plurality of stages, and
    the data is continuously input or output and transferred by repeated execution by pipeline processing.

4. The storage device as set forth in claim 1, wherein the storage device has an output register, and
    performs the second processing includes pipeline processing of
    a first stage in which at least the internal counter is updated and the sense amplifiers are selected from the generated column address and
    a second stage in which the data of the selected sense amplifiers is latched at the output register and output to the outside.

5. The storage device as set forth in claim 4, wherein the first stage further performs the function of further decoding the data of the selected sense amplifiers for error correction.

6. The storage device as set forth in claim 5, wherein
    the storage device has an input register, and
    performs a third stage where the decoded data is latched at the input register, encoded again, and written back into the sense amplifiers, and
    the processing of the second stage and the third stage are executed in parallel with respect to the data decoded at the first stage.

7. A file storage device using a ferroelectric memory as a cache memory and using a hard disk or a flash memory as a main storage medium,
    the ferroelectric memory having
    a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film,
    sense amplifiers connected to the bit lines and selected by a column address,
    an internal counter able to generate the column address, and
    a control part configured to control a data access, wherein the control part accesses the data by
    a first processing of reading out a plurality of words of data from memory cells of a word line and a plate line selected according to a row address and storing it in the sense amplifiers,
    a second processing of selecting sense amplifiers from the column address and inputting/outputting data with the outside, and
    a third processing of writing back the data of the sense amplifiers into the memory cells,
    with the data being continuously input or output and transferred by repeatedly executing the second processing using the column address generated in the internal counter for a group of words read out to the sense amplifiers at the first processing.

8. A computer system comprising:
    a system memory and
    a processing unit configured to transfer a data with the system memory, in which
    the system memory includes a ferroelectric memory,
    the ferroelectric memory having
    a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by a column address, an internal counter able to generate the column address, and a control part configured to control a data access, wherein the control part accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processing using the column address generated in the internal counter for a group of words read out to the sense amplifiers at the first processing.

9. The computer system as set forth in claim 8, wherein the processing unit has a cache memory, and the ferroelectric memory is accessed via the cache memory.

10. A computer system comprising:

a system memory, a processing unit configured to transfer a data with the system memory through a system bus, and a file storage device connected with the system bus through an interface circuit and including a cache memory, at least one of the system memory and the cache memory of the file storage device including a ferroelectric memory, the ferroelectric memory having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by a column address, an internal counter able to generate the column address, and a control part configured to control a data access, wherein the control part accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with the data being continuously input or output and transferred by repeatedly executing the second processing using the column address generated in the internal counter for a group of words read out to the sense amplifiers at the first processing.

11. A storage device comprising:

a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film;

sense amplifiers connected to the bit lines and selected by a column address;

an internal counter able to generate the column address; and a control means for controlling a data access, wherein the control means accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processing using the column address generated in the internal counter for a group of words read out to the sense amplifiers at the first processing.

12. A file storage device using a ferroelectric memory as a cache memory and using a hard disk or a flash memory as a main storage medium, the ferroelectric memory having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by a column address, an internal counter able to generate the column address, and a control means for controlling a data access, wherein the control means accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with the data being continuously input or output and transferred by repeatedly executing the second processing using the column address generated in the internal counter for a group of words read out to the sense amplifiers at the first processing.

13. A computer system comprising:

a system memory and a processing means for transferring a data with the system memory in which the system memory includes a ferroelectric memory, the ferroelectric memory having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by a column address, an internal counter able to generate the column address, and a control means for controlling a data access, wherein the control means accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with data being continuously input or output and transferred by repeatedly executing the second processing using the column address generated in the internal counter for a group of words read out to the sense amplifiers at the first processing.

14. A computer system comprising:

a system memory, a processing means for transferring a data with the system memory through a system bus, and a file storage device connected with the system bus through an interface circuit and including a cache memory, with at least one of the system memory and the cache memory of the file storage device including a ferroelectric memory, the ferroelectric memory having a ferroelectric memory cell array including a plurality of memory cells, each having a selection transistor connected to a bit line and selected and driven by a word line and a ferroelectric capacitor having a first electrode connected to the selection transistor and having a second electrode connected to a plate line and storing two values according to polarization states of a ferroelectric film, sense amplifiers connected to the bit lines and selected by a column address, an internal counter able to generate the column address, and a control means for controlling a data access, wherein the control means accesses the data by a first processing of reading out a plurality of words of data from memory cells of a word line and a plate line selected according to a row address and storing it in the sense amplifiers, a second processing of selecting sense amplifiers from the column address and inputting/outputting data with the outside, and a third processing of writing back the data of the sense amplifiers into the memory cells, with the data being continuously input or output and transferred by repeatedly executing the second processing using the column address generated in the internal counter for a group of words read out to the sense amplifiers at the first processing.

* * * * *